(12) United States Patent
Lee (10) Patent No.: US 8,710,562 B2
(45) Date of Patent: *Apr. 29, 2014

(54) CMOS IMAGE SENSOR

(75) Inventor: Won-Ho Lee, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 253 days.

This patent is subject to a terminal disclaimer.

(21) Appl. No.: 13/236,772

(22) Filed: Sep. 20, 2011

(65) Prior Publication Data

US 2012/0007665 A1    Jan. 12, 2012

Related U.S. Application Data

(63) Continuation of application No. 11/645,515, filed on Dec. 27, 2006, now Pat. No. 8,063,423.

(30) Foreign Application Priority Data

Dec. 27, 2005 (KR) .............................. 2005-0130489

(51) Int. Cl.
*H01L 31/062* (2012.01)
*H01L 31/113* (2006.01)

(52) U.S. Cl.
USPC ........................................................ 257/292

(58) Field of Classification Search
USPC .................. 257/290–294, E31.073, E31.127
See application file for complete search history.

(56) References Cited

U.S. PATENT DOCUMENTS

| 6,924,544 B2 | 8/2005 | Wada et al. |
| 8,063,423 B2 * | 11/2011 | Lee ............................... 257/292 |
| 2003/0112352 A1 | 6/2003 | Tanaka |
| 2005/0148114 A1 | 7/2005 | Rhodes |

FOREIGN PATENT DOCUMENTS

| JP | 06-326928 | 11/1994 |
| JP | 2001-094880 | 4/2001 |
| JP | 2001-197367 | 7/2001 |
| JP | 2000001025 | 7/2001 |
| JP | 2005-086232 | 3/2005 |
| KR | 10-0318408 B1 | 12/2001 |

* cited by examiner

*Primary Examiner* — Cuong Q Nguyen
(74) *Attorney, Agent, or Firm* — McAndrews, Held & Malloy, Ltd.

(57) ABSTRACT

A CMOS image sensor includes a photodiode, a plurality of transistors for transferring charges accumulated at the photodiode to one column line, and a voltage dropping element connected to a gate electrode of at least one transistor among the plurality of transistors for expanding a saturation region of the transistor by dropping down a gate voltage inputted to the gate electrode of the at least one transistor.

20 Claims, 15 Drawing Sheets

CMOS IMAGE SENSOR

FIELD OF THE INVENTION

The present invention relates to a semiconductor technology; and, more particularly, to a complementary metal oxide semiconductor (CMOS) image sensor.

DESCRIPTION OF RELATED ART

In recent years, a demand for a digital camera shows a tendency to explosively increase with the development of visual communication technology using an Internet. In addition, with an increasing supply of a mobile communication terminals such as a personal digital assistant (PDA), an international mobile telecommunications-2000 (IMT-2000), a code division multiple access (CDMA) terminal or the like, in which a camera is mounted, a demand for a miniature camera module increases accordingly.

The camera module includes an image sensor basically. In general, the image sensor is a device for converting an optical image into an electrical signal. A charge coupled device (CCD) image sensor and a complementary metal oxide semiconductor (CMOS) image sensor are widely used.

The CCD image sensor, however, has several disadvantages: power consumption is too high; a manufacturing process is too complicated because of a plurality of masking processes; and the CCD image sensor is hardly manufactured in one chip because it is difficult to embody a signal processing circuit within the chip. On the contrary, since the CMOS image sensor can be manufactured such that control, drive and signal processing circuits are integrated into a monolithic integrated circuit within a single chip, it is looming large recently. Besides, in virtue of low voltage performance, low power consumption, compatibility with peripheral devices, usefulness of a standard CMOS manufacturing process, the CMOS image sensor requires relatively low manufacturing cost in comparison with the CCD image sensor.

However, in the CMOS image sensor, an analog signal generated by a light-receiving element such as a photodiode or the like, has various parasitic effects caused by parasitic capacitance, resistance, dark current leakage, inconformity of semiconductor device characteristic, etc. These parasitic effects, which inevitably occur in the semiconductor device, cause a signal to noise ratio of image data to be degraded. Therefore, the noise acts as an important factor that restricts the performance of the CMOS image sensor.

As causes for noise in the CMOS image sensor, for example, there are kt/C noise with regard to image data sampling, 1/f noise with regard to a circuit used for amplifying an image signal, and fixed pattern noise (FPN) with regard to inconformity of the signal processing circuit in the image sensor. Among these, since the FPN is easily detected by a user's eyes as it is represented as longitudinal lines or stripes, it looks terribly bad to the user's eyes.

Figure 1:
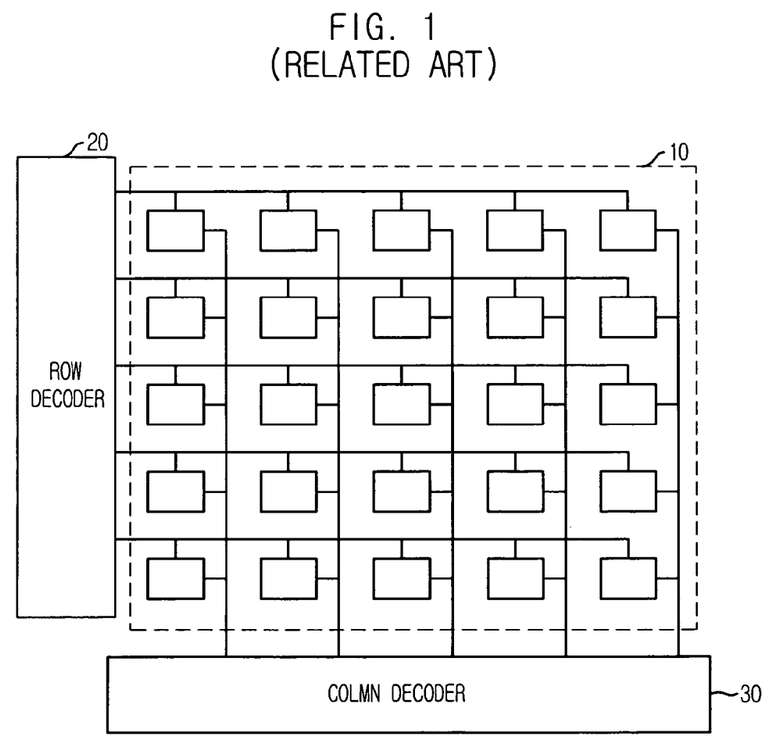
FIG. 1 is a schematic view of a conventional complementary metal oxide semiconductor (CMOS) image sensor having a square shaped unit pixel.

FIG. 1 is a schematic view of a conventional CMOS image sensor having a square shaped unit pixel.

Referring to FIG. 1, a row decoder 20 for decoding a row address is disposed at one side of a pixel array 10, and a column decoder 30 for decoding a column address is disposed at another side. Herein, the column decoder 30 connected to outputs of pixel data is arranged in a predetermined direction perpendicular to the row decoder 20.

A procedure of reading data from the conventional CMOS image sensor having the above configuration will be set forth more fully below.

To begin with, when the row decoder 20 selects a first row, and the column decoder 30 then selects a first column, data of a corresponding selected pixel is read out and thereafter the data of the corresponding selected pixel is amplified. Afterwards, when the row decoder 20 selects a second row, and the column decoder 30 then selects a second column, data of a corresponding selected pixel is read out and thereafter the data of the corresponding selected pixel is amplified. In this manner, data for all pixels are read out.

There are various kinds of unit pixels used in the CMOS image sensor, of which one is a 3-transistor (3-T) structure configured with three transistors and one photodiode, another one is a 4-transistor (4-T) structure configured with four transistors and one photodiode.

Figure 2:
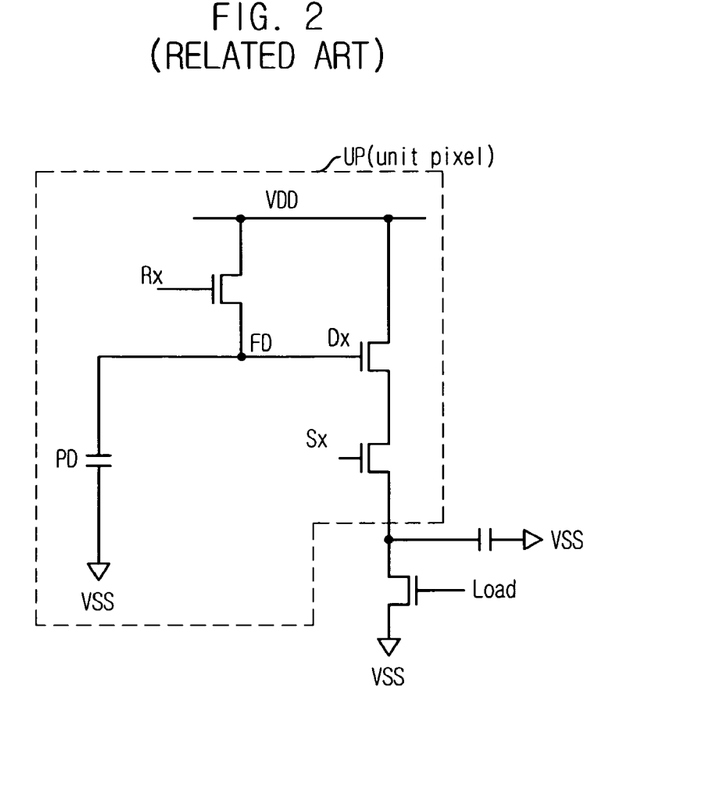
FIG. 2 is a circuit diagram setting forth a typical 3-T structure among the various kinds of unit pixels for the conventional CMOS image sensor.

FIG. 2 is a circuit diagram setting forth a typical 3-T structure among the various kinds of unit pixels for the conventional CMOS image sensor.

Referring to FIG. 2, a 3-T structured pixel includes one photodiode PD for converting photons into electrons and storing them, and three NMOS transistors. Herein, the three NMOS transistors are configured with a reset transistor Rx for resetting one end of the photodiode PD to a power voltage level VDD, a drive transistor Dx acting as a buffer amplifier configured as a source follower which is operated according to the charges accumulated at the photodiode PD, and a select transistor Sx for performing a switching operation for addressing.

Figure 4:
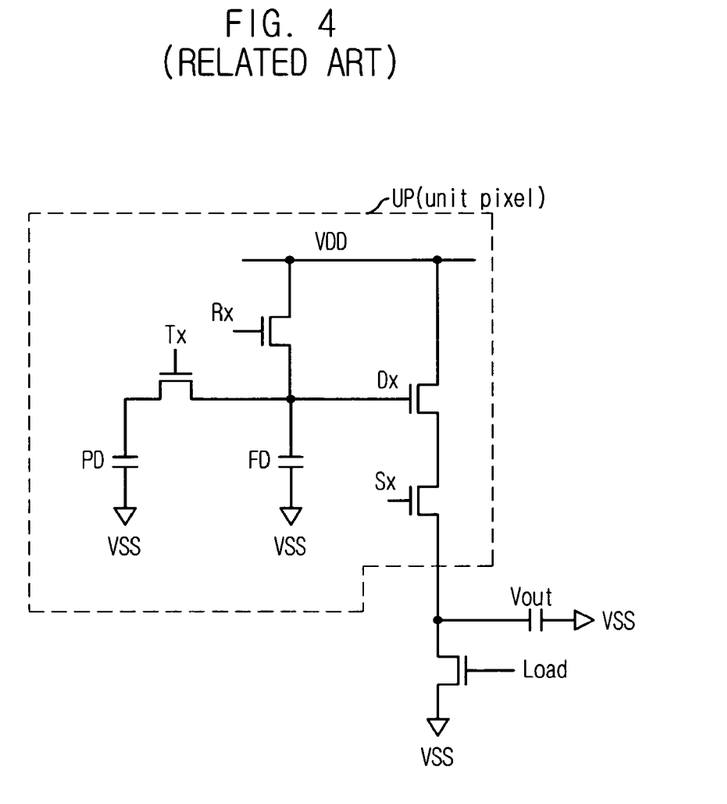
FIG. 4 is a circuit diagram setting forth a typical 4-T structure among the various kinds of unit pixels for the conventional CMOS image sensor.

FIG. 4 is a circuit diagram setting forth a typical 4-T structure among the various kinds of unit pixels for the conventional CMOS image sensor.

Referring to FIG. 4, a 4-T structured pixel includes one photodiode PD and four NMOS transistors. Herein, the four NMOS transistors are configured with a transfer transistor Tx for transferring photo-generated charges accumulated at the photodiode PD to a floating diffusion region FD, a reset transistor Rx for setting the floating diffusion region FD to a desired potential level and resetting the floating diffusion region FD by discharging the charges, and a drive transistor Dx acting as a buffer amplifier configured as a source follower which is operated according to the charges stored at the floating diffusion region FD, and a select transistor Sx for performing a switching operation for addressing.

As it is understood from FIGS. 2 and 4, a significant difference between the 3-T and 4-T structured pixels is whether or not the transfer transistor Tx and the floating diffusion region FD exist. The 3-T structured pixel detects a reset level by turning on the reset transistor Rx after detecting a signal level in advance, whereas the 4-T structured pixel detects a signal level by turning on the transfer transistor Tx after detecting a reset level by turning on the reset transistor Rx in advance.

Figure 3:
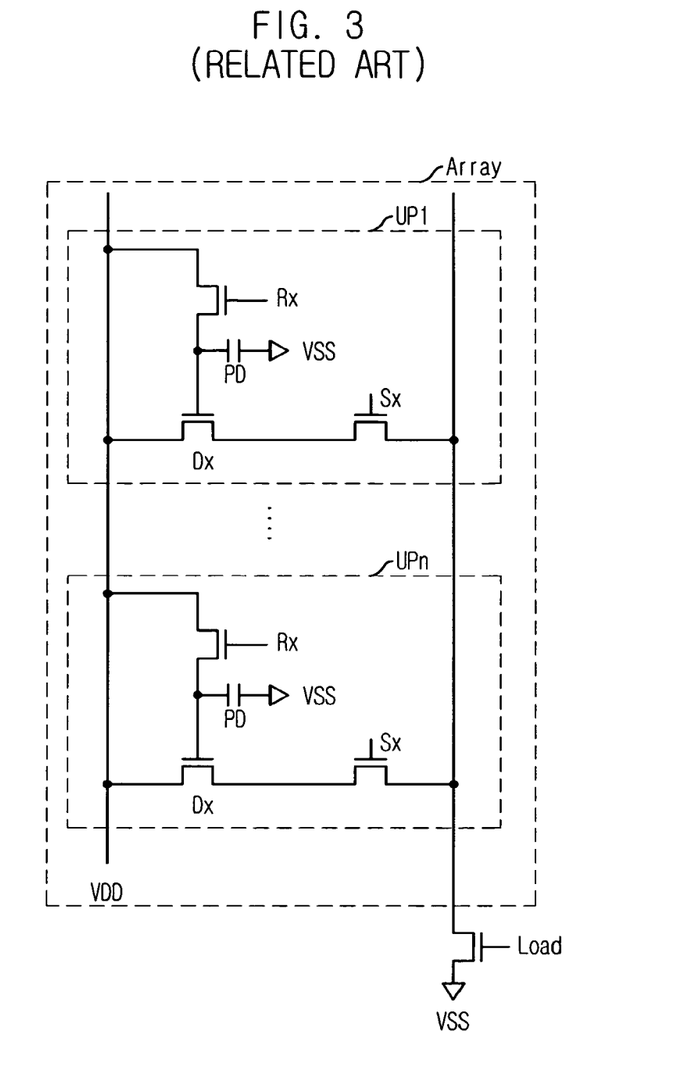
FIG. 3 is a circuit diagram of a pixel array in which the 3-T structured pixels of FIG. 2 commonly share one column line.

Meanwhile, FIG. 3 is a circuit diagram of a pixel array in which the 3-T structured pixels of FIG. 2 commonly share one column line. Referring to FIG. 3, respective unit pixels UP1~UPn are commonly connected to one column line so as to be connected to one load transistor Load.

Figure 5:
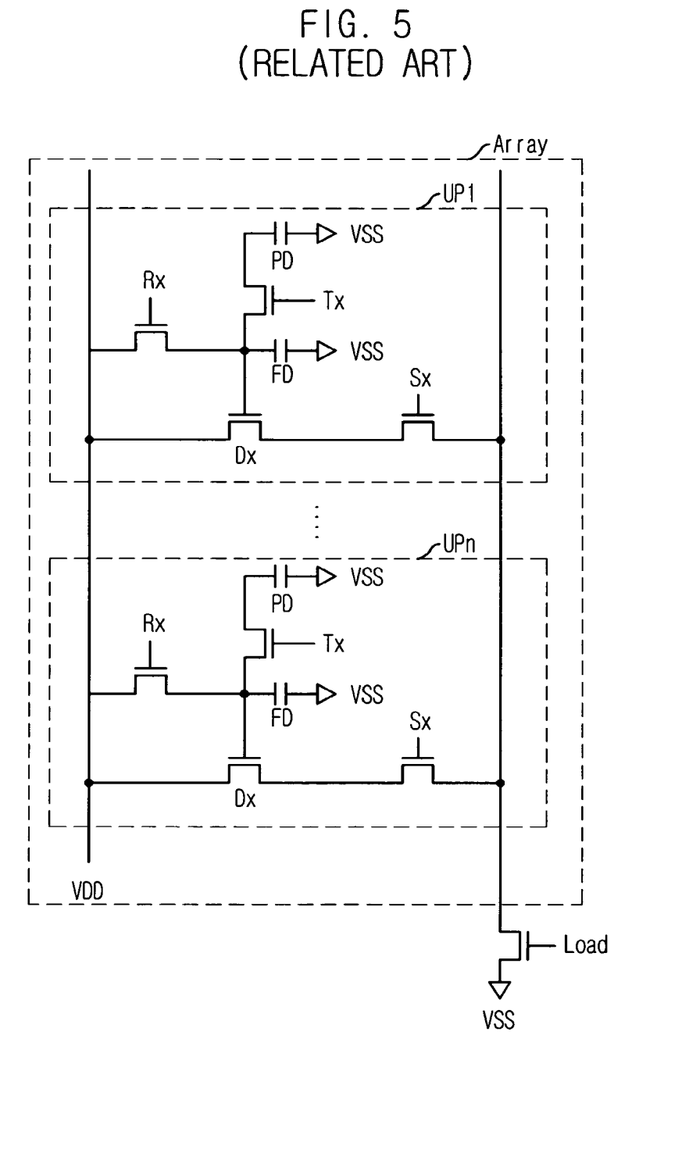
FIG. 5 is a circuit diagram of a pixel array in which the 4-T structured pixels of FIG. 4 commonly share one column line.

FIG. 5 is a circuit diagram of a pixel array in which the 4-T structured pixels of FIG. 4 commonly share one column line. Referring to FIG. 5, respective unit pixels UP1~UPn are commonly connected to one column line so as to be connected to one load transistor Load.

As shown in FIGS. 3 and 5, a plurality of 3-T or 4-T structured unit pixels are configured such that the plurality of pixels commonly share one column line and they are connected to one load transistor Load through the column line. Here, a signal is read out and outputted for every column line, as illustrated in FIG. 1.

Since pixel data outputted from the plurality of pixels are read through one column line, a fixed noise pattern (FPN) occurs due to an offset difference generated in every pixel during the manufacturing process. One of causes for the FPN is a variation of a channel length caused by a variation of a final inspection critical dimension (FICD) of a gate electrode of an adjacent transistor, and a consequent variation of saturation current.

Currently, the characteristics of a transistor to which 0.18 μm CMOS image sensor technology is applied is shown below.

TABLE 1

| Kind of Transistor | W/L (μm) | Idsat (μA) | Idsat' (μA/μm) |
|---|---|---|---|
| Load Tr. | 2/2 | 256 | 128 |
|  | 2/4 | 139 | 70 |
|  | 4/2 | 506 | 124 |
| Dx & Sx Tr. | 0.25/0.35 | 150 | 600 |

Figure 6A:
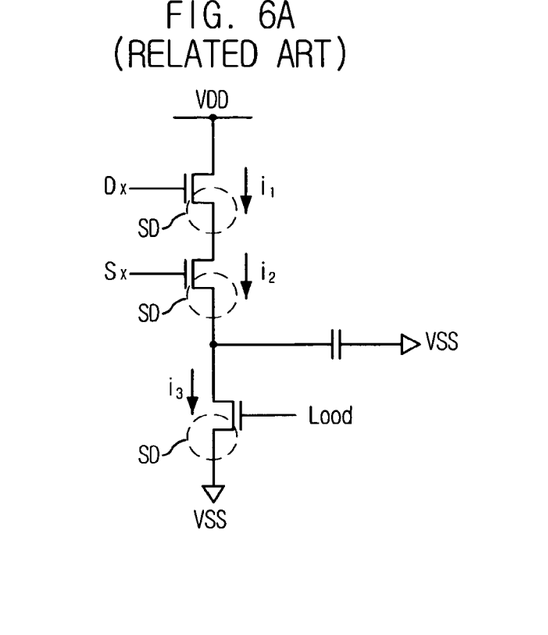
FIGS. 6A and 6B are a circuit diagram and a plane view, respectively, illustrating a drive transistor and a select transistor of a unit pixel.
Figure 6B:
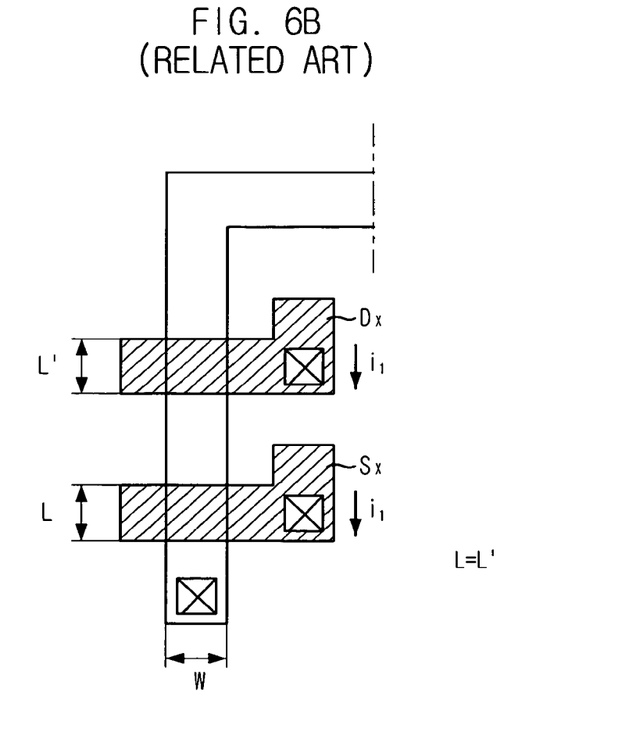

Referring to FIGS. 6A and 6B, and the table 1, the conventional unit pixel is designed such that gate electrode lengths L of the drive and select transistors Dx and Sx are equal to each other. Accordingly, a driving current is about 150 μA at the drive and select transistors Dx and Sx, and about 260 μA at the load transistor Load.

In general, the driving current in driving the CMOS image sensor is determined as a value corresponding to the driving current of the drive or select transistor Dx or Sx, which has a minimum driving current. Therefore, the manufacturing process of the drive or select transistors Sx or Dx should be precisely controlled.

However, there occurs a problem that the FICD of the gate electrode is changed during etching process for defining the gate electrodes of the drive and select transistors Dx and Sx. This change of the FICD of the gate electrode varies the driving current, which leads to a column fixed pattern noise.

SUMMARY OF THE INVENTION

It is, therefore, an object of the present invention to provide an image sensor capable of solving a limitation in that a column fixed noise pattern is caused by a change of a final inspection critical dimension (FICD) of a gate electrode in a transistor constituting a unit pixel.

In accordance with an aspect of the present invention, there is provided a CMOS image sensor including a photodiode and a plurality of transistors switching a charge accumulated at the photodiode and transferring the charge to one column line, wherein at least one transistor among the plurality of transistors comprises a gate electrode having a voltage drop unit for dropping a gate voltage input to the gate electrode to expand a saturation region of the transistor.

In accordance with another aspect of the present invention, there is provided a CMOS image sensor including, a photodiode, a first transistor for resetting the photodiode, a second transistor for amplifying and outputting a charge accumulated at the photodiode, a third transistor for transferring a signal output from the second transistor to a column line, and a voltage dropping element connected to a gate electrode of a first or third transistor for expanding a saturation region of the first or third transistor by dropping down a gate voltage inputted to the gate electrode of the first or third transistor.

In accordance with further another aspect of the present invention, there is provided a CMOS image sensor including a photodiode, a first transistor for resetting the photodiode, a second transistor for transferring a charge accumulated at the photodiode to a floating diffusion region, a third transistor for amplifying and outputting a charge accumulated at the floating diffusion region, a fourth transistor for transferring a signal output from the third transistor to one column line, and a voltage dropping element connected to a gate electrode of a first, second or fourth transistor for expanding a saturation region of the first, second or fourth transistor by dropping down a gate voltage inputted to the gate electrode of the first, second or fourth transistor.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A complementary metal oxide semiconductor (CMOS) image sensor in accordance with exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals in the drawings denote like elements.

Figure 7:
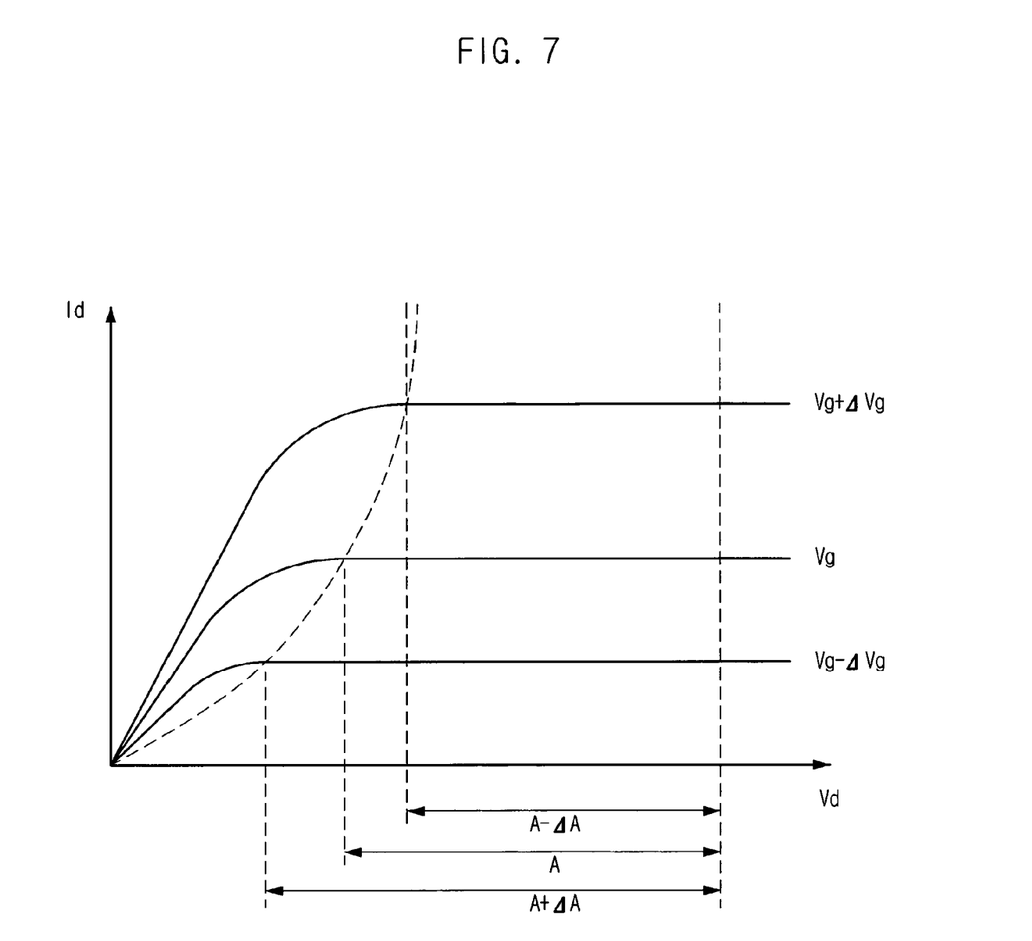
FIG. 7 is a graph illustrating a technical principle of the present invention.

In the present invention, a gate voltage of transistors constituting a unit pixel is reduced by means of the change of a mask without an additional process, and thus a saturation region of the transistor can be expanded. Accordingly, it is possible to eliminate column fixed pattern noise by controlling the transistor to operate within the saturation region. That is, as shown in FIG. 7, the saturation region A may be expanded by ΔA as the gate voltage Vg of the transistor is reduced by ΔVg.

First Embodiment

Figure 8A:
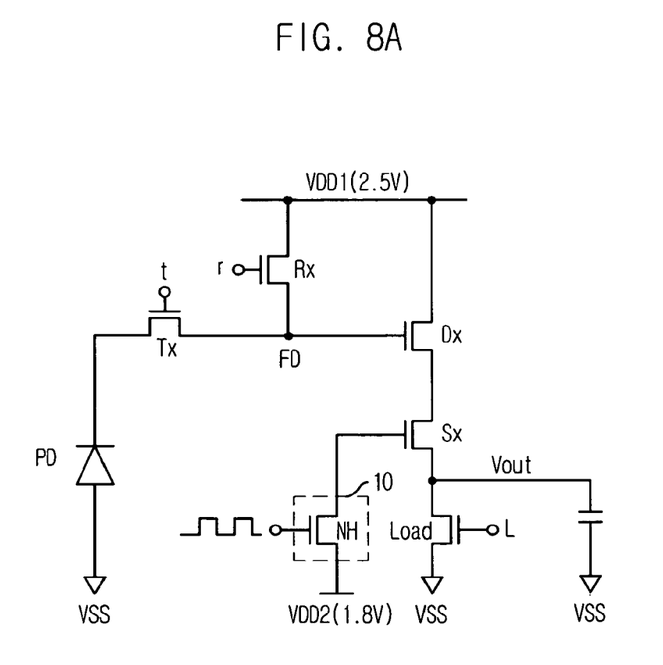
FIGS. 8A and 8B, and FIGS. 9A and 9B are circuit diagrams illustrating a unit pixel of a CMOS image sensor in accordance with a first embodiment of the present invention.
Figure 8B:
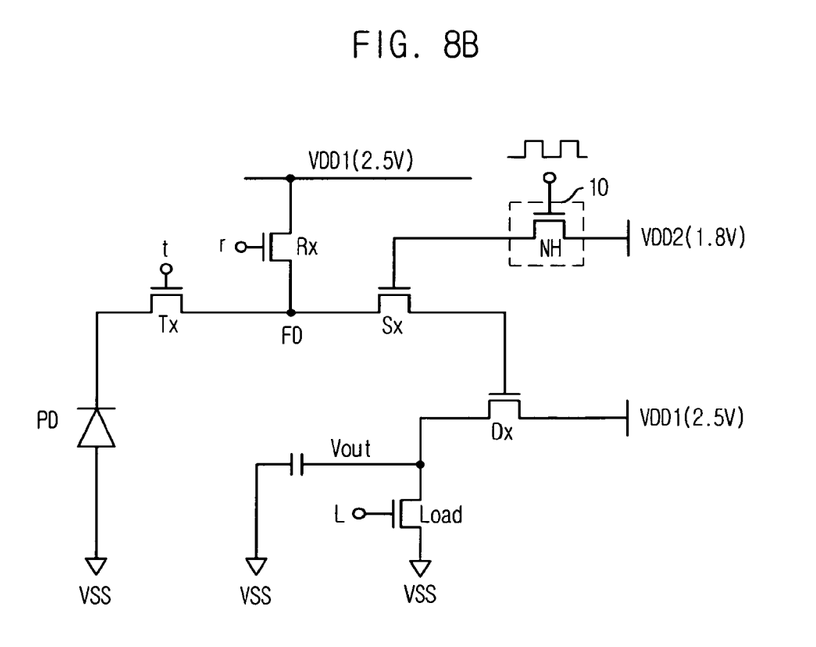
Figure 9A:
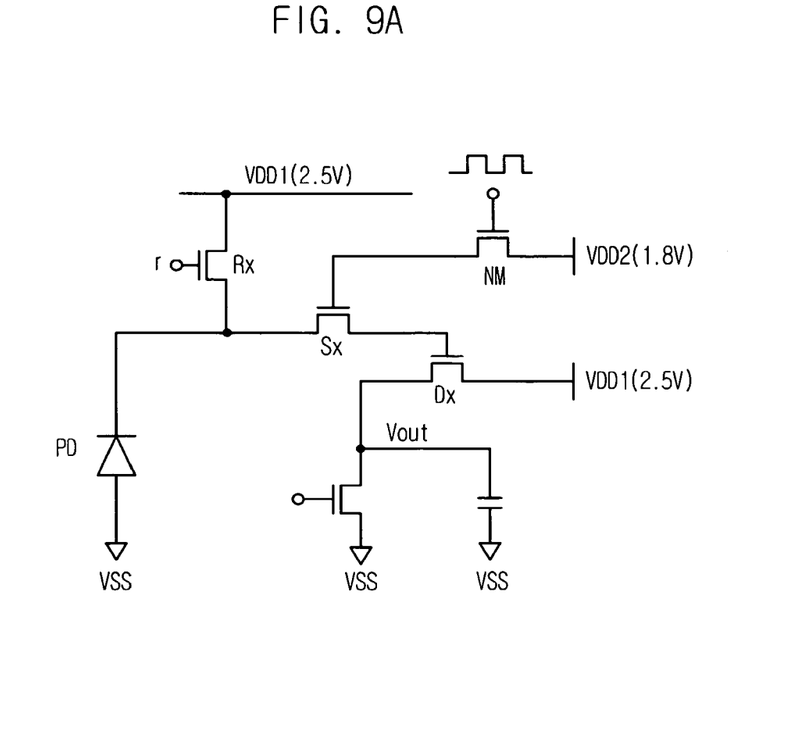
Figure 9B:
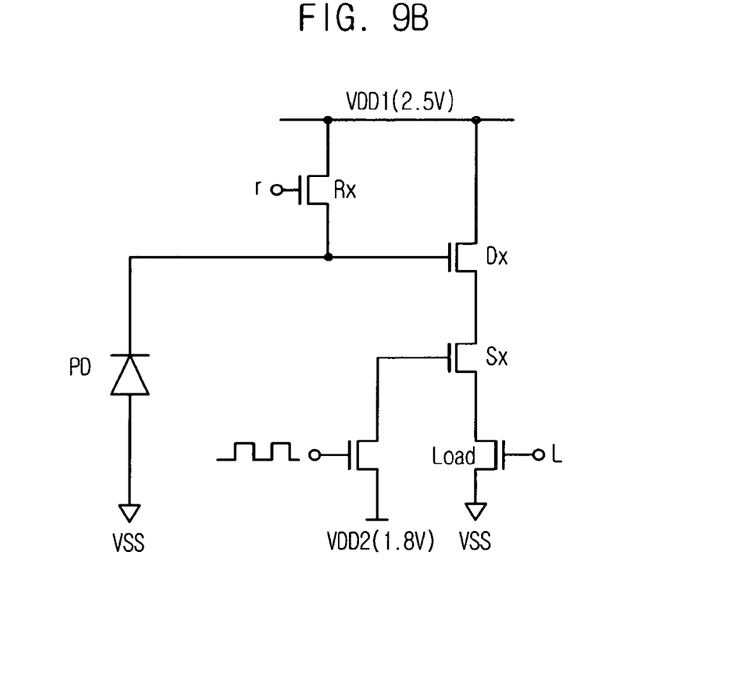

FIGS. 8A and 8B, and FIGS. 9A and 9B are circuit diagrams illustrating a unit pixel of a CMOS image sensor in accordance with a first embodiment of the present invention. Herein, FIGS. 8A and 8B are circuit diagrams illustrating a 4-T structured unit pixel having four transistors, and FIGS. 9A and 9B are circuit diagrams illustrating a 3-T structured unit pixel having three transistors.

FIG. 8A is a circuit diagram illustrating a structure where a select transistor Sx is connected between an output terminal Vout and a source of a drive transistor Dx, and FIG. 8B is a circuit diagram illustrating a structure where a select transistor Sx is connected between a floating diffusion region FD and a gate of a drive transistor Dx. In addition, FIG. 9A is a circuit diagram illustrating a structure where a select transistor Sx is connected between a reset transistor Rx and a gate of a drive transistor Dx, and FIG. 9B is a circuit diagram illustrating a structure where a select transistor Sx is connected between the drive transistor Dx and a load transistor Load.

Referring to FIGS. 8A and 8B, and FIGS. 9A and 9B, in the unit pixel of the CMOS image sensor in accordance with the first embodiment of the present invention, a second power voltage VDD2 is used as a gate voltage for the select transistor Sx, wherein the second power voltage VDD2 has a lower voltage level than a first power voltage VDD1. To this end, there is additionally employed a switching device 10 between the gate of the select transistor Sx and the second power voltage VDD2. Herein, the first power voltage VDD1 is set to approximately 2.5V, and the second power voltage VDD2 is set to approximately 1.8V.

Although the switching device 10 may configured as an NMOS or a PMOS transistor, it is preferable that the switching device 10 is configured as the NMOS transistor NM in consideration of a fabrication process and an application of gate bias (2.5V), because all the transistors constituting the unit pixel are configured as the NMOS transistor. Further, it is preferable that the NMOS transistor NM is configured as a native transistor of which a threshold voltage is nearly zero such that that the NMOS transistor may operate only as a switching device without any voltage drop.

Second Embodiment

Figure 10A:
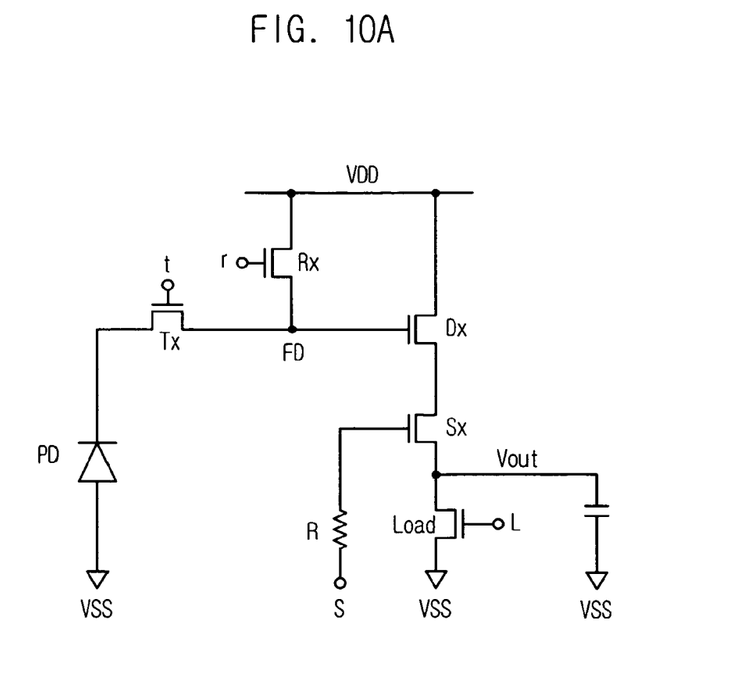
FIGS. 10A and 10B, and FIGS. 11A and 11B are circuit diagrams illustrating a unit pixel of a CMOS image sensor in accordance with a second embodiment of the present invention.
Figure 10B:
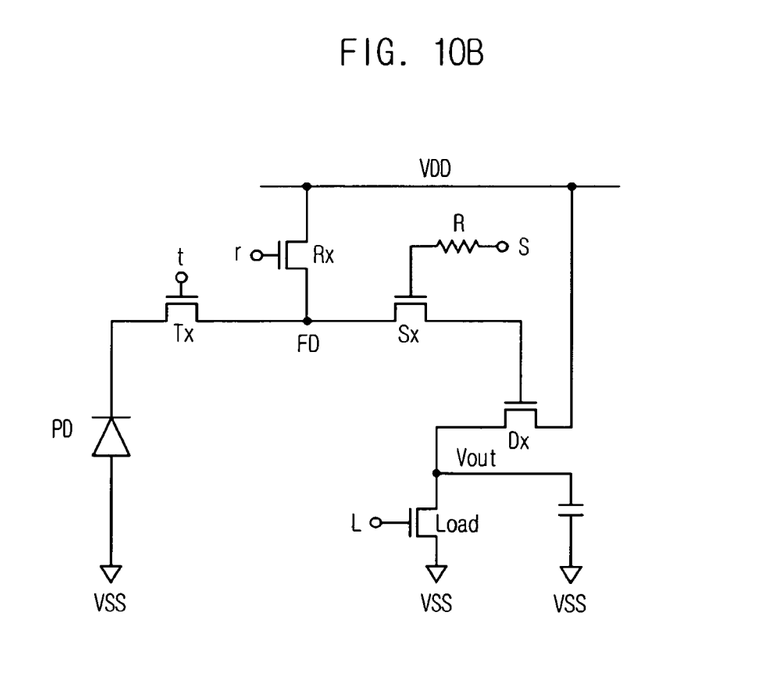
Figure 11A:
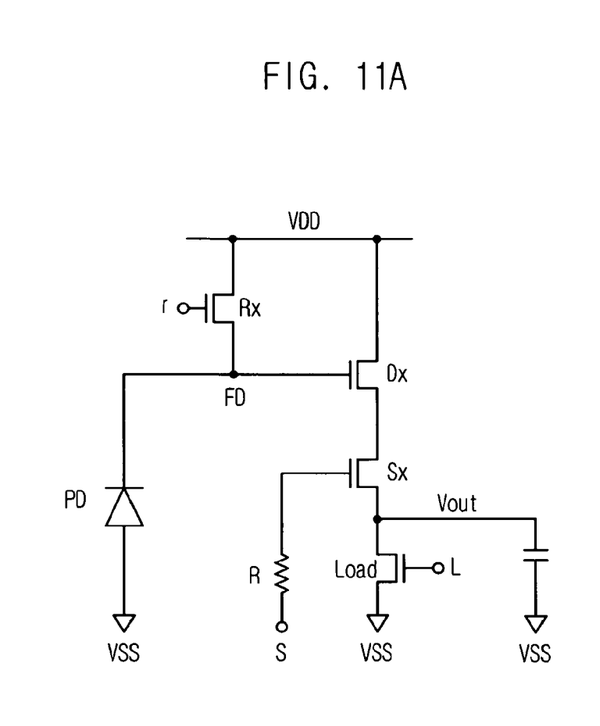
Figure 11B:
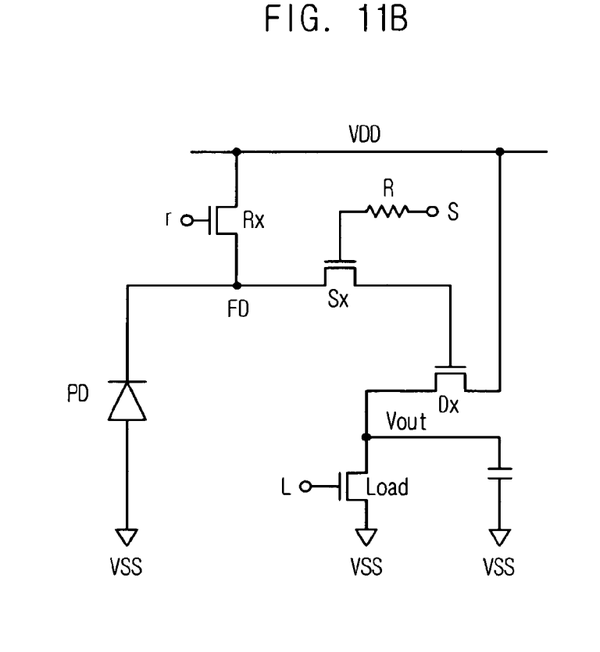

FIGS. 10A and 10B, and FIGS. 11A and 11B are circuit diagrams illustrating a unit pixel of a CMOS image sensor in accordance with a second embodiment of the present invention. Herein, FIGS. 10A and 10B are circuit diagrams illustrating a 4-T structured unit pixel, and FIGS. 11A and 11B are circuit diagrams illustrating a 3-T structured unit pixel.

Referring to FIGS. 10A and 10B, and FIGS. 11A and 11B, a unit pixel of a CMOS image sensor in accordance with the second embodiment of the present invention includes a resistor R connected to a gate of a select transistor Sx to drop down a gate voltage of the select transistor Sx. Therefore, the gate voltage is dropped down by a predetermined resistance of the resistor R and the dropped voltage is then applied to the gate of the select transistor Sx.

The resistor R is not formed by additional process but formed by self aligned silicide (SALICIDE) process, in accordance with the second embodiment of the present invention. Therefore the fabrication process for the CMOS image sensor can be simplified and there is not required an additional area. The SALICIDE process will be illustrated more fully later.

Third Embodiment

Figure 12A:
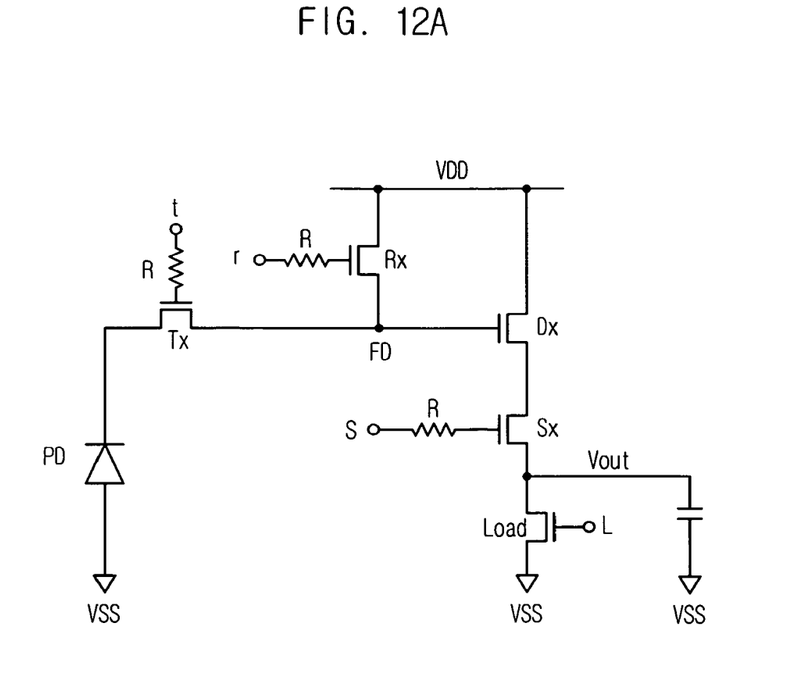
FIGS. 12A and 12B, and FIGS. 13A and 13B are circuit diagrams illustrating a unit pixel of a CMOS image sensor in accordance with a third embodiment of the present invention.
Figure 12B:
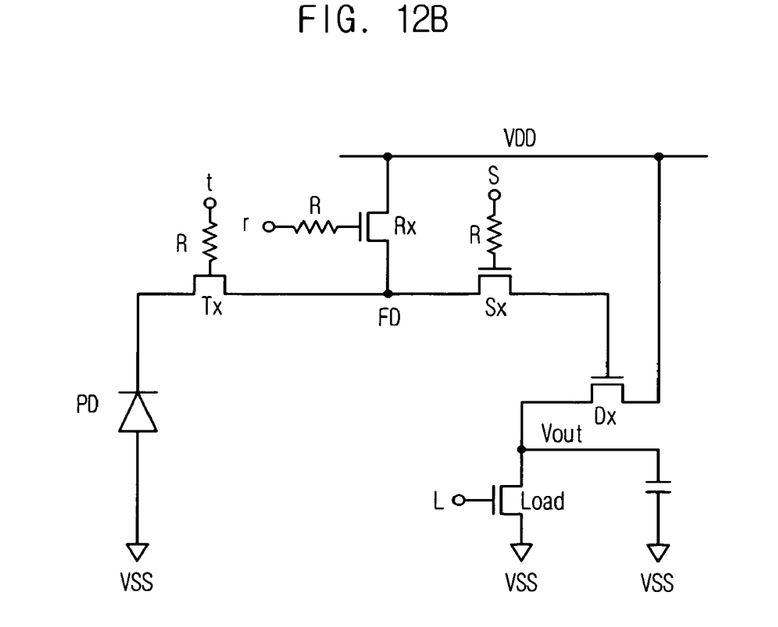
Figure 13A:
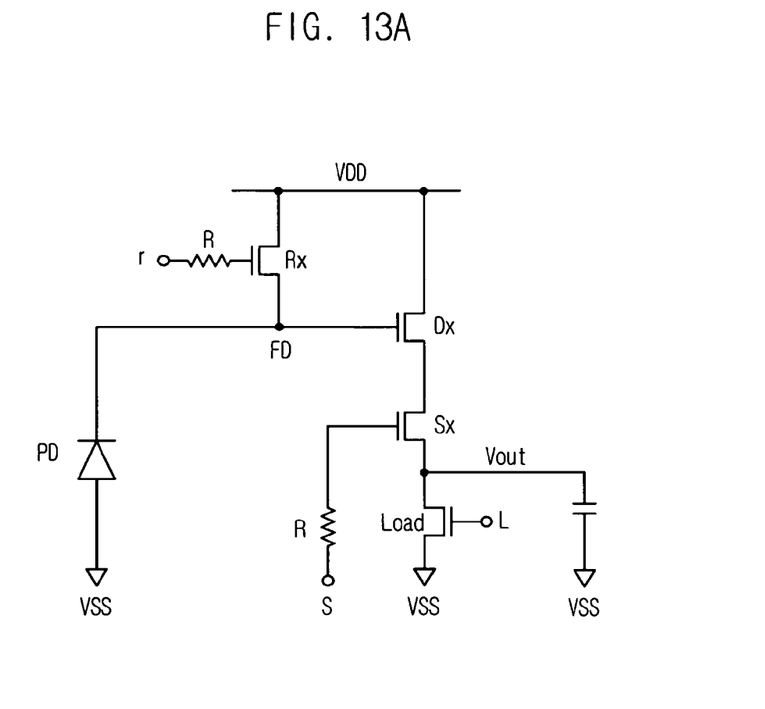
Figure 13B:
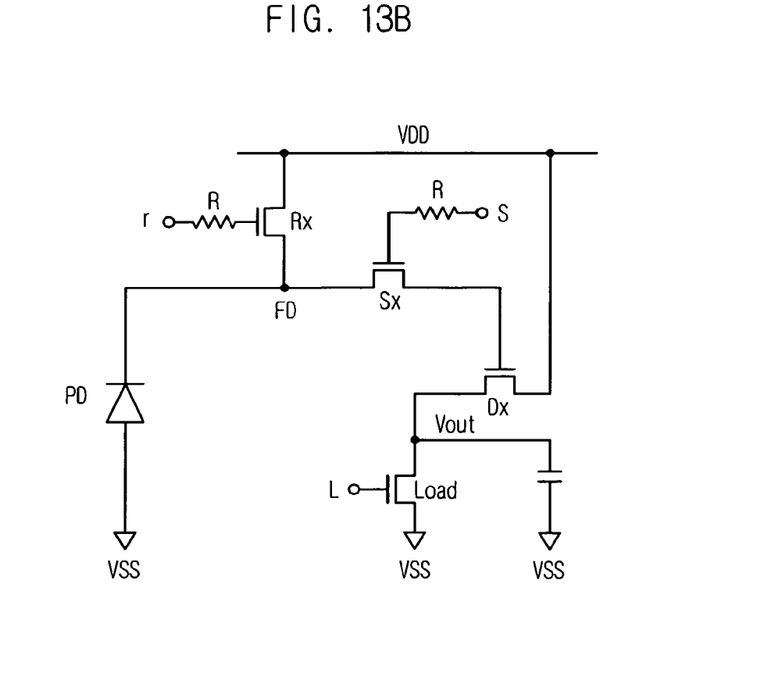

FIGS. 12A and 12B, and FIGS. 13A and 13B are circuit diagrams illustrating a unit pixel of a CMOS image sensor in accordance with a third embodiment of the present invention. Herein, FIGS. 12A and 12B are circuit diagrams illustrating a 4-T structured unit pixel, and FIGS. 13A and 13B are circuit diagrams illustrating a 3-T structured unit pixel.

Referring to FIGS. 12A and 12B, and FIGS. 13A and 13B, a unit pixel of a CMOS image sensor in accordance with the third embodiment of the present invention includes resistors R connected to respective gates of a transfer transistor Tx(not shown in the 3-T structured unit pixel) and a reset transistor Rx as well as a gate of a select transistor Sx. Therefore, the gate voltages are dropped down by resistances of the resistors R and the reduced voltages are then applied to the respective gates of the transistors Tx, Rx and Sx.

The SALICIDE process for embodying the resistor will be illustrated with reference to FIG. 14 and FIGS. 15A and 15B.

Figure 14:
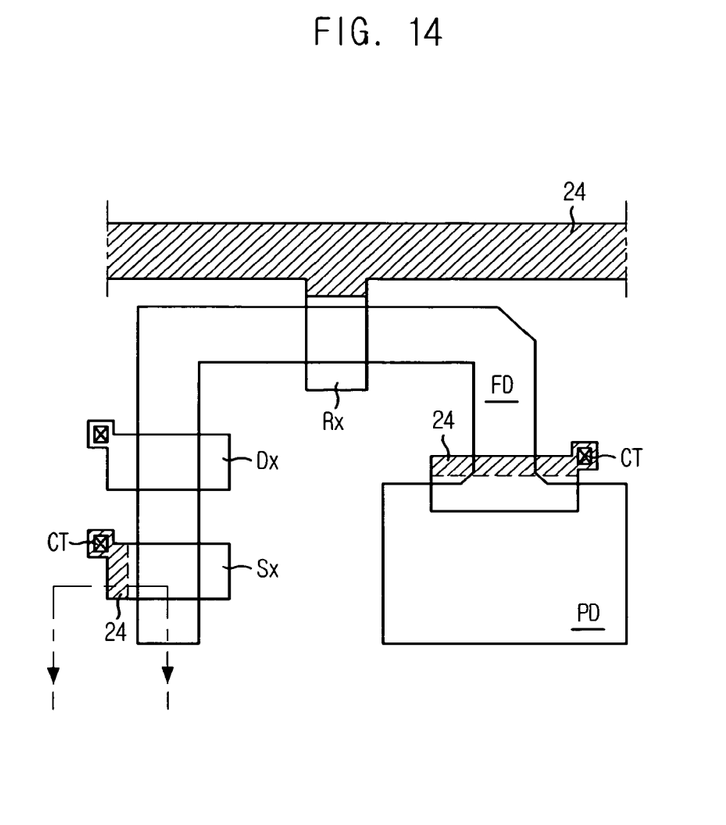
FIG. 14 is a plane view illustrating the unit pixel of the CMOS image sensor shown in FIG. 12.
Figure 15A:
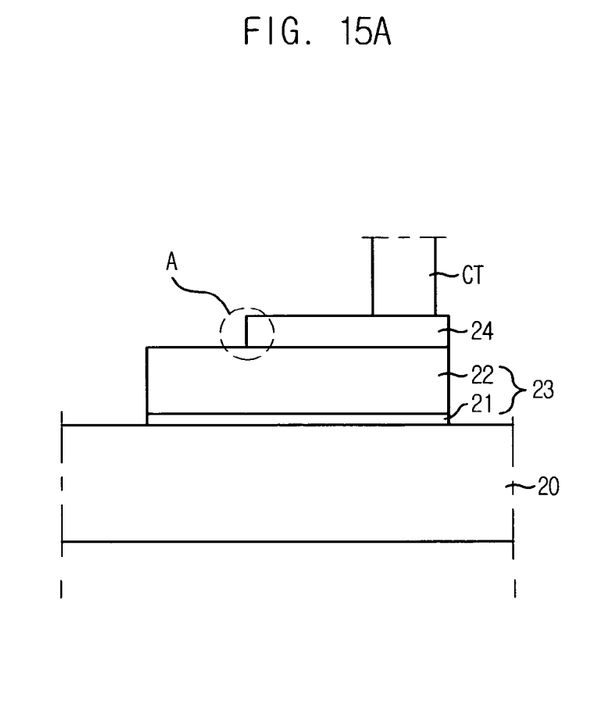
FIG. 15A is a sectional view taken along line I-I' of FIG. 14.
Figure 15B:
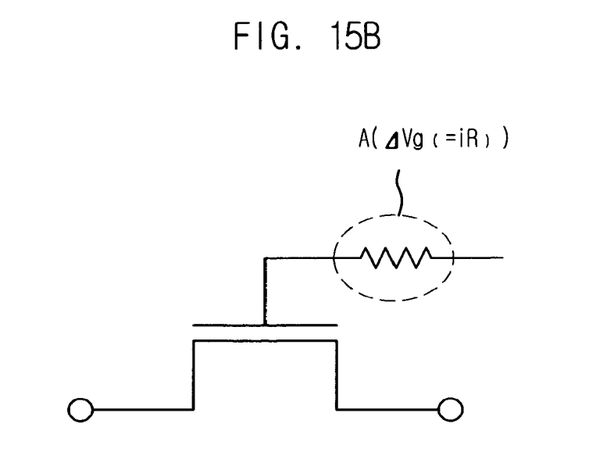
FIG. 15B is an equivalent circuit diagram of FIG. 15A.

FIG. 14 is a plane view of a 4-T structured unit pixel illustrating the self align silicide process, and FIG. 15A is a sectional view taken along line I-I' of FIG. 14 and FIG. 15B is an equivalent circuit diagram of FIG. 15A.

As shown in FIGS. 14 and 15A, a silicide layer 24 is formed only on portions of gate electrodes 23 of the transfer transistor Tx, the reset transistor Rx, and the select transistor Sx, respectively. That is, the gate electrode 23 has a stacked structure of a gate insulation layer 21 and a polysilicon layer 22, and the silicide layer 24 is only partially formed on the polysilicon layer 22, which is represented as a hatched line.

In the above exemplary structure, the resistance of the portion where the silicide layer 24 is formed is different from that of the portion where the silicide layer 24 is not formed. That is, the portion where the silicide layer 24 is formed has a lower resistance than the portion where the silicide layer 24 is not formed. As a result, it is possible to obtain an equivalent circuit depicted in FIG. 15B.

As described above with the help of exemplary embodiments of the present invention, a predetermined voltage dropping element is disposed to the gate of transistor(s) in the unit pixel for dropping down the gate voltage so that a saturation region of each transistor is expanded to thereby remove a column fixed noise pattern.

In addition, in accordance with the present invention, the resistor is used as the voltage dropping element and the resistor can be embodied by changing masks through the SALICIDE process without any additional process so that it is possible to improve product yield.

The present application is a continuation of U.S. patent application No. Ser. 11/645315, filed on Dec. 27, 2006, the entirety of which is herein incorporated by reference. The present application claims priority to Korean patent application No. KR 2005-0130489, filed in the Korean Patent Office on Dec. 27, 2005, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A circuit comprising:
   a plurality of transistors including:
      a first transistor configured to reset a photodiode,
      a second transistor configured to receive a charge from the photodiode and to output an amplified signal, and
      a third transistor configured to transfer the amplified signal to a column line;

wherein at least one source of the plurality of transistors or at least one drain of the plurality of transistors is configured to receive a first voltage;

wherein at least one gate of the plurality of transistors is configured to receive a second voltage; and wherein the second voltage is less than the first voltage.

2. The circuit of claim 1, further comprising a switching device configured to selectively provide the second voltage to the at least one gate of the plurality of transistors.

3. The circuit of claim 2, wherein the switching device comprises an NMOS transistor.

4. The circuit of claim 3, wherein the switching device comprises a threshold voltage of approximately zero.

5. The circuit of claim 1, wherein the first voltage is approximately 0.7 volts greater than the second voltage.

6. The circuit of claim 1, wherein the first voltage comprises approximately 2.5 volts and the second voltage comprises approximately 1.8 volts.

7. The circuit of claim 1, wherein the at least one gate of the plurality of transistors is a gate of the third transistor.

8. A circuit comprising:
a plurality of transistors including:
a first transistor configured to reset a photodiode,
a second transistor configured to receive a charge from the photodiode and to output an amplified signal,
a third transistor configured to transfer the amplified signal to a column line, and
a fourth transistor configured to transfer the charge from the photodiode to the second transistor;
wherein at least one source of the plurality of transistors or at least one drain of the plurality of transistors is configured to receive a first voltage;
wherein at least one gate of the plurality of transistors is configured to receive a second voltage; and
wherein the second voltage is less than the first voltage.

9. The circuit of claim 8, further comprising a switching device configured to selectively provide the second voltage to the at least one gate of the plurality of transistors.

10. The circuit of claim 9, wherein the switching device comprises an NMOS transistor.

11. The circuit of claim 10, wherein the switching device comprises a threshold voltage of approximately zero.

12. The circuit of claim 8, wherein the first voltage is approximately 0.7 volts greater than the second voltage.

13. The circuit of claim 8, wherein the first voltage comprises approximately 2.5 volts and the second voltage comprises approximately 1.8 volts.

14. The circuit of claim 8, wherein the at least one gate of the plurality of transistors is a gate of the third transistor.

15. A method for operating a circuit, the method comprising:
receiving a first voltage by at least one source or at least one drain of a plurality of transistors;
receiving a second voltage by at least one gate of the plurality of transistors;
wherein the second voltage is less than the first voltage; and
wherein the plurality of transistors includes:
a first transistor configured to reset a photodiode,
a second transistor configured to receive a charge from the photodiode and to output an amplified signal, and
a third transistor configured to transfer the amplified signal to a column line.

16. The method of claim 15, wherein said receiving a second voltage by at least one gate of the plurality of transistors further comprises switching a switching device to selectively provide the second voltage to the at least one gate of the plurality of transistors.

17. The method of claim 16, wherein the switching device comprises an NMOS transistor.

18. The method of claim 17, wherein the switching device comprises a threshold voltage of approximately zero.

19. The method of claim 15, wherein the first voltage is approximately 0.7 volts greater than the second voltage.

20. The method of claim 15, wherein the at least one gate of the plurality of transistors is a gate of the third transistor.

* * * * *